United States Patent
McGee

(10) Patent No.: US 10,390,447 B1
(45) Date of Patent: Aug. 20, 2019

(54) MULTI PART PLASTIC ASSEMBLY THAT SNAPS INTO OR IS CAPTURED INTO EXISTING PLASTIC OR METAL JUNCTION BOXES, SWITCH BOXES AND RECEPTACLE BOXES TO SIMPLIFY CONNECTION WIRING TO INDIVIDUAL SWITCHES, RECEPTACLES, USB PORTS, GFCIS

(71) Applicant: Michael Dale McGee, Lake Havasu City, AZ (US)

(72) Inventor: Michael Dale McGee, Lake Havasu City, AZ (US)

(73) Assignee: Michael Dale McGee, Lake Havasu City, AZ (US)

( * ) Notice: Subject to any disclaimer, the term of this patent is extended or adjusted under 35 U.S.C. 154(b) by 0 days.

(21) Appl. No.: 16/211,169

(22) Filed: Dec. 5, 2018

(51) Int. Cl.
| | |
|---|---|
| *H05K 5/00* | (2006.01) |
| *H01R 9/24* | (2006.01) |
| *H05K 1/11* | (2006.01) |
| *H01R 4/30* | (2006.01) |
| *H01R 24/28* | (2011.01) |
| *H01R 25/00* | (2006.01) |

(52) U.S. Cl.
CPC ......... *H05K 5/0069* (2013.01); *H01R 9/2491* (2013.01); *H05K 1/112* (2013.01); *H05K 5/0047* (2013.01); *H05K 5/0073* (2013.01); *H01R 4/305* (2013.01); *H01R 24/28* (2013.01); *H01R 25/006* (2013.01); *H05K 2201/09227* (2013.01); *H05K 2201/09609* (2013.01); *H05K 2201/09754* (2013.01); *H05K 2201/10303* (2013.01)

(58) Field of Classification Search
CPC .... H01R 9/2491; H01R 24/28; H01R 25/006; H05K 5/0069; H05K 5/0047; H05K 5/0073
USPC .......................................... 439/83
See application file for complete search history.

(56) References Cited

U.S. PATENT DOCUMENTS

| | | | | |
|---|---|---|---|---|
| 2,433,917 | A * | 1/1948 | McCartney | H01R 25/006 174/50 |
| 3,609,647 | A * | 9/1971 | Castellano | H02G 3/16 439/535 |
| 4,165,443 | A * | 8/1979 | Figart | H02G 3/16 174/53 |

(Continued)

*Primary Examiner* — Alexander Gilman

(57) ABSTRACT

The present invention is an assembly and system that is captured into a standard plastic or metal junction box, switch box or receptacle box to simplify wiring electrical power to current day switches, receptacles, smoke detectors and other configurations of custom switch, receptacle, receptacle/USB ports, GFCIs, etc. The invention is used to eliminate excessive amounts of wire stuffed into the back of the junction box and reducing the time required to wire standard and custom electrical receptacles. The invention consists of a two part fire resistant plastic box and printed circuit board where the PCB is captured inside the two part box having openings on the top for electrical terminals and wire pins that exactly, and fully align with the bottom of standard electrical receptacles or the wire pins may terminate in spade connectors that are captured by screw terminals on the receptacles. Also, there is an added safety feature of this present invention, in that all wiring that exists in current wiring practice today, 85% of it is done away with because of the printed circuit board (PCB) that is encapsulated.

7 Claims, 11 Drawing Sheets

(56) References Cited

U.S. PATENT DOCUMENTS

| | | | | |
|---|---|---|---|---|
| 5,471,012 A * | 11/1995 | Opel | ............. | H02G 3/16 174/53 |
| 6,220,880 B1 * | 4/2001 | Lee | ............. | H01R 25/003 439/214 |
| 6,617,511 B2 * | 9/2003 | Schultz | ............. | H01R 27/00 174/53 |
| 6,786,766 B1 * | 9/2004 | Chopra | ............. | H01R 4/4827 439/441 |
| 6,937,461 B1 * | 8/2005 | Donahue, IV | ............. | H01R 13/514 174/50 |
| 6,939,179 B1 * | 9/2005 | Kieffer, Jr. | ............. | H01R 13/514 439/650 |
| 6,945,815 B1 * | 9/2005 | Mullally | ............. | H01H 1/5866 439/180 |
| 7,160,147 B1 * | 1/2007 | Stephan | ............. | H01R 9/24 174/60 |
| 7,425,677 B2 * | 9/2008 | Gates | ............. | H01R 13/508 174/481 |
| 7,637,771 B2 * | 12/2009 | Laursen | ............. | H04Q 1/062 211/26 |
| 8,415,561 B2 * | 4/2013 | Gates | ............. | H01R 13/508 174/481 |
| 8,608,490 B2 * | 12/2013 | Keswani | ............. | H01R 12/7088 439/76.1 |
| 8,668,347 B2 * | 3/2014 | Ebeling | ............. | H01R 13/5213 362/95 |
| 8,921,694 B2 * | 12/2014 | Moss | ............. | H02G 3/16 174/481 |
| 9,258,919 B1 * | 2/2016 | Rose | ............. | H02G 3/0412 |
| 9,570,835 B2 * | 2/2017 | Newell | ............. | H02G 3/18 |
| 9,793,697 B1 * | 10/2017 | Colao | ............. | H02G 3/16 |
| 9,825,447 B1 * | 11/2017 | Gorman | ............. | H02G 3/18 |
| 9,844,143 B2 * | 12/2017 | Utz | ............. | H05K 3/325 |
| 9,991,636 B2 * | 6/2018 | Derousse | ............. | H01R 13/6395 |
| 10,070,539 B2 * | 9/2018 | Gates | ............. | H02G 3/081 |
| 2006/0154503 A1 * | 7/2006 | Kidman | ............. | H01R 13/447 439/136 |
| 2013/0196532 A1 * | 8/2013 | Utz | ............. | H01R 13/5812 439/471 |
| 2013/0196535 A1 * | 8/2013 | Utz | ............. | H01R 43/26 439/536 |

\* cited by examiner

MULTI PART PLASTIC ASSEMBLY THAT SNAPS INTO OR IS CAPTURED INTO EXISTING PLASTIC OR METAL JUNCTION BOXES, SWITCH BOXES AND RECEPTACLE BOXES TO SIMPLIFY CONNECTION WIRING TO INDIVIDUAL SWITCHES, RECEPTACLES, USB PORTS, GFCIS

FIELD OF INVENTION

The field of invention relates to plastic or metal junction boxes, switch boxes and receptacle boxes in residential and commercial construction.

BACKGROUND

New construction of residences and commercial structures always have new electrical installations. New electrical wiring is generally referred to as "rough in" wiring. This generally consists of pulling of electrical wire from a circuit breaker box to individual receptacle boxes. Receptacle boxes receive the rough-in wire and will contain one or more electrical receptacles that may be switches or sockets.

One major concern of work time is the connection of the rough-in wiring to the actual receptacles. This consists of cutting electrical wires to length, stripping a given length of insulation from each wire then either forcing the bare wires into a tension clamp hole or forming a "U" shape using a pair of long nose plyers, first hooking the U shape under a screw head and then, second, tightening the screw, pinching the wire between the base of the screw connector and the screw head. In large buildings containing thousands of receptacle boxes can consume thousands of man hours connecting the receptacles to the rough-in wiring. A second consideration is the amount of wire remaining between the entry hole into the receptacle box and the receptacle itself. The length of the remaining wire generally varies from electrician to electrician. Rough-in wiring will generally be stapled to wood studs so a rough-in wire cut too short generally cannot be pulled by itself to makeup for the shortness. Rough-in wiring cut too long results in wire that in some cases requires it to be folded multiple times so that the Z-axis height of the receptacle can be contained in the receptacle box. Often this results in the folded wire being pounded into the receptacle box which can result in the insulation being damaged and presents a fire hazard.

Electrical wiring in new residential structures come with the same problems as found in new commercial structures. Home owners remodeling their own structures often results in bad wiring practices where fires from electrical wiring can be more severe than in commercial structures because of the lack of fire suppression systems.

Electrical receptacles being installed consist of dozens to hundreds to thousands of receptacles in home to commercial installations and can represent thousands of dollars or more in labor costs. If the cost of a journeyman electrician including overhead and burden is, for example, $50/Hr., and if the savings of using the instant invention results in a three minute installation of a receptacle instead of a 20 minute installation of the same receptacle, then the savings over a 1,000 receptacle is 283 man hours or 14,167 dollars.

If the invention is supplied to building sites with the receptacles already connected to the invention then the time to install a given receptacle to the rough out wiring is even less. Considering that the invention can be provided with two or more receptacles of different types such as a dual socket, one or more single pole single through switches then the cost savings become even greater.

Problem Statement

What is needed is some device or system to reduce the time of installation of electrical receptacles and switches in both commercial and residential structures and remodeling projects.

SUMMARY

The instant invention discloses a number of devices and systems to alleviate most or all of the problems electricians and home owners encounter performing electrical installations, receptacle repairs and remodeling.

Embodiments

Reference will now be made in detail to various embodiments, examples of which are illustrated in the accompanying drawings. Wherever possible, the same reference numbers will be used throughout the drawings to refer to the same or like parts.

Definitions

Receptacle Box: A receptacle box is the container for the space behind electrical fittings such as power outlet sockets or light switches. Receptacle boxes may be designed for either surface mounting (with cabling running along the wall surface) or for embedding in the wall, attached to a stud or skirting board.

Receptacle: An electrical outlet or receptacle is a socket that connects an electrical device to an electricity supply. In buildings, electrical outlets are usually contained within a receptacle box or "J" Box (Junction Box) and installed in the wall.

Square Pins: The wire or pins normally used to establish electrical contact in a tension clamp suffers from a small surface area of a round wire. A square size of the same cross sectional area will have a larger surface area of the wire in the tension clamp.

Spade Pins: A spade pin is a pin with a spade connector on the pin allowing the electrical connection between the pin and a terminal on a receptacle to be made by securing the spade pin to a screw terminal on the receptacle rather than via a tension clamp USB ports: An electrical receptacle containing USB charging ports has internal circuitry to convert alternating current to 5 volts DC (Direct Current). Generally, there are two USB ports contained on an electrical receptacle. The specific connector for the USB port will be either a type "A" or type "C" port.

GFCI: A GFCI (ground fault circuit interrupter) is a special type of outlet that detects dangerous ground faults and immediately turns off the power to stop shocks. GFCI's can also be wired to protect other outlets on the same circuit.

Backstabbing connections: The method of connecting electrical wires to the back of electrical receptacles through the use of push-in (screwless push-in terminal), which accepts 14 gauge (NM-B 14/2) wire only. This wiring method is informally known as "backstabbing".

EMBODIMENTS

Reference will now be made in detail to various embodiments, examples of which are illustrated in the accompanying drawings. Wherever possible, the same reference numbers will be used throughout the drawings to refer to the same or like parts.

In a first exemplary embodiment an apparatus assembly and system is disclosed where fire resistant plastic structures comprising a subcomponents (object 14 of FIG. 1) case. This subcomponents case contains a printed circuit board (PCB) (object 16B of FIG. 1), a spring clamp box (object 12 of FIG. 1), pins (objects 18A-18D of FIG. 1), and a bottom enclosure cover (object 22 of FIG. 1) and an electrical receptacle (object 72 of FIG. 6). In this embodiment, the instant invention may be shipped by a vendor as a preassembled apparatus or may be shipped to a vendor or customer with the electrical receptacle attached to the preassembled apparatus.

Figure 1:
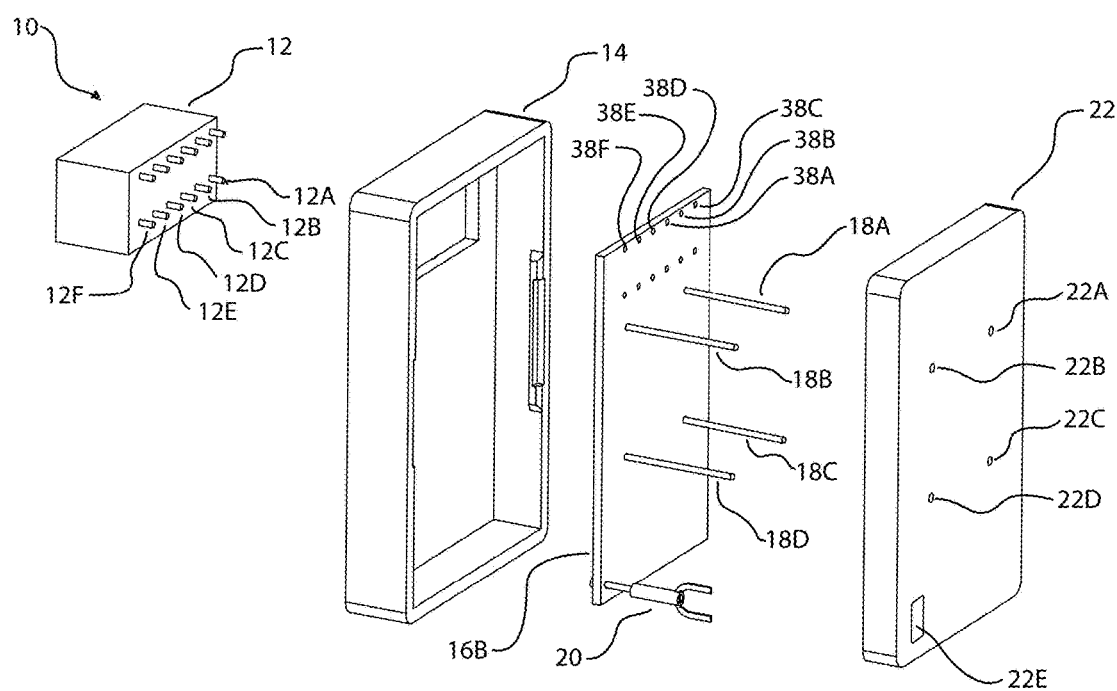
FIG. 1 is an exploded view of the of subcomponents case 14, spring cage 12 with a plurality of pins arranged as 2 rows of 6 pins in each row, printed circuit board (PCB) 16, PCB pins 18A through 18D, ground spade pin 20, and bottom enclosure cover 22 making up the assembly.
Figure 6:
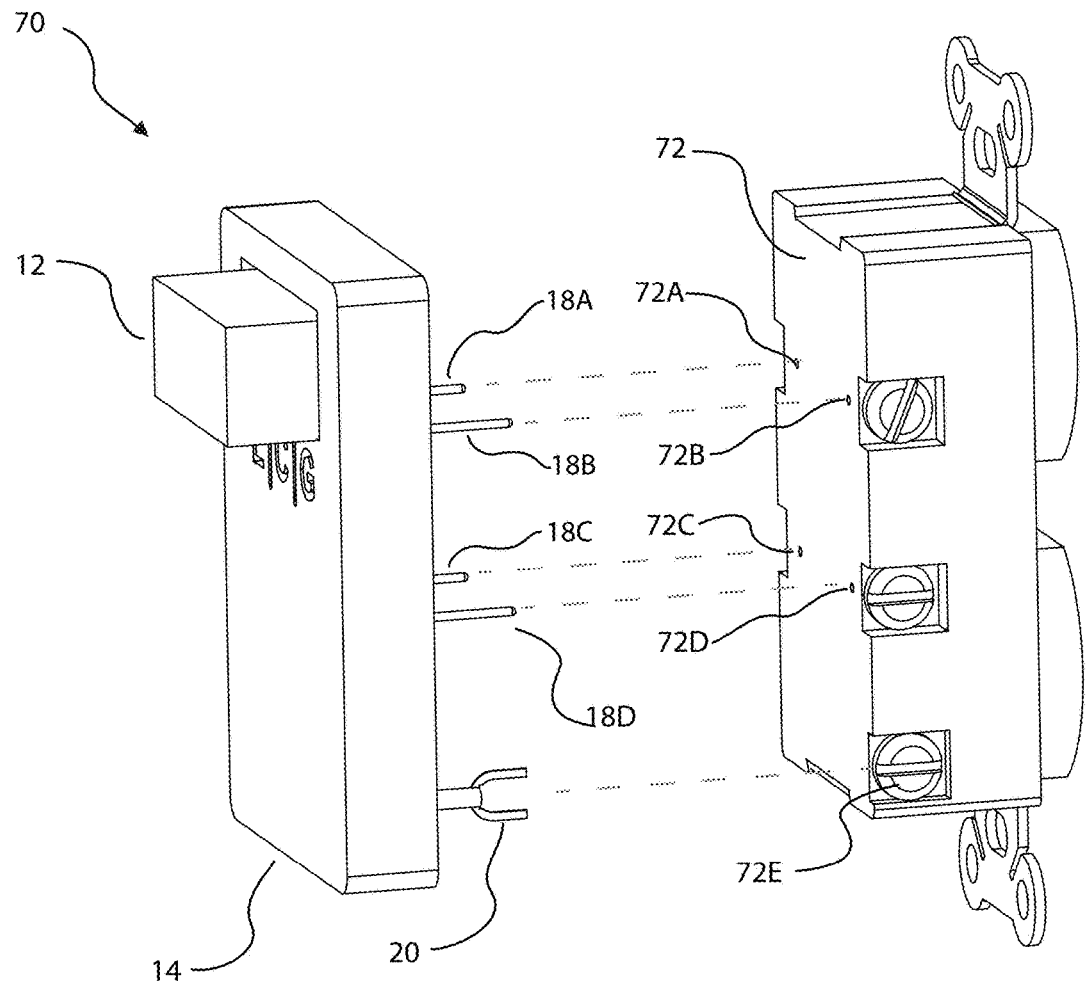
FIG. 6 is an isometric side, back, and top view of subcomponents case 14, spring cage 12, PCB pins 18A, 18B, 18C, 18D, receptacle 72 showing the screw terminal 72E, and tension clamp holes 72A, 72B, 72C, and 72D.

In a related embodiment, the pins 18A-18D of FIG. 1 may be square pins instead of round pins to increase the surface area of each pin to be inserted into the tension clamps of the electrical receptacle through tension clamp access holes (objects 72A-72D of FIG. 6).

Figure 9:
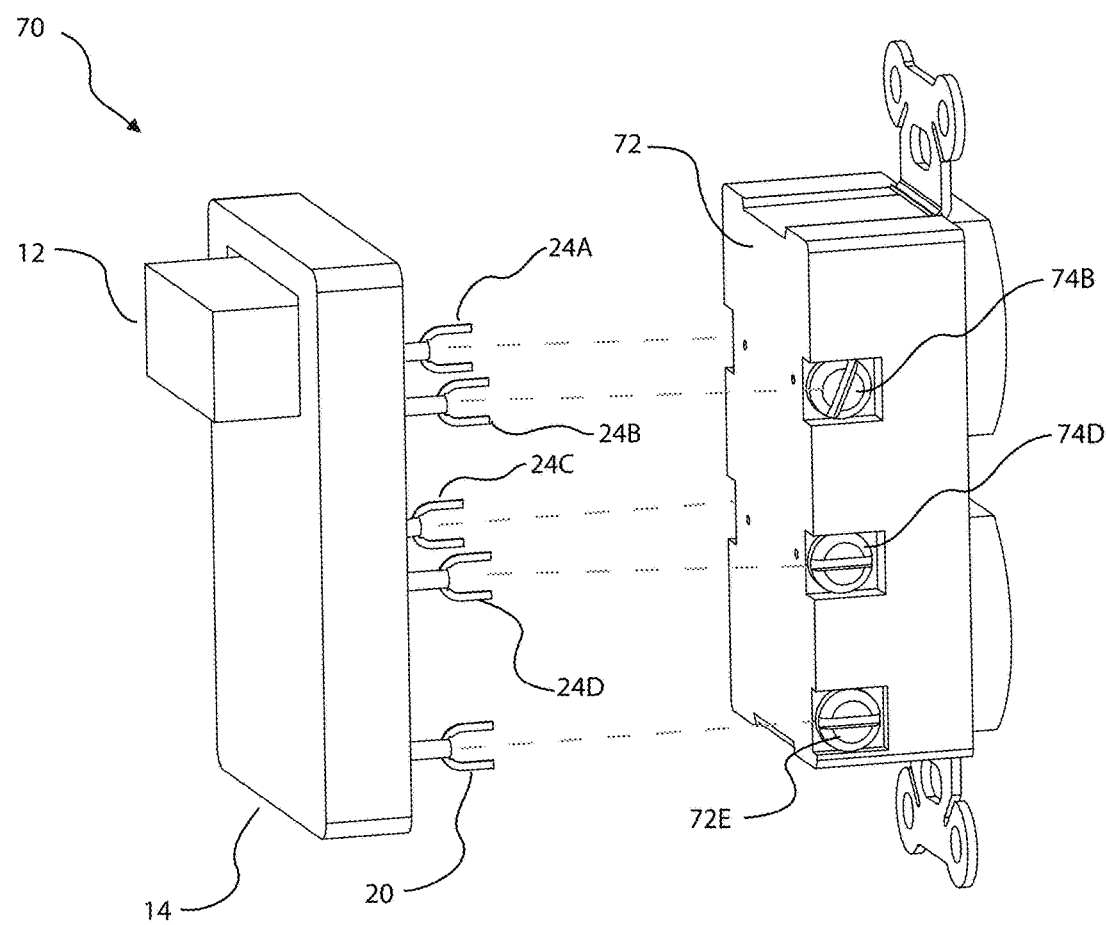
FIG. 9 is an isometric view of subcomponents case 14 with spring cage 12 and electrical receptacle 72. In this depiction, spade pins 20 and 24A-24D are shown in alignment, with dotted lines, between securing screws 74A (not shown), 74B, 74C (not shown) and 74D. Ground spade pin 20 is shown in alignment to securing screw 72E with dotted lines between Ground spade pin 20 and securing screw 72E.

In another related embodiment, pins 18A-18D of FIG. 1 may be replaced with spade pins (objects 24A-24D of FIG. 9) with spade pins relocated such that they align with screw terminals (objects 74A and 74C not shown and 74B and 74D shown of FIG. 9). This embodiment allows spade pins, which have a larger surface area for contact with screw terminals 74A-74D of FIG. 9 than either round pins 18A-18D of FIG. 1 or square pins 74A-74D of FIG. 9 that contact their mating tension clamps contained in electrical receptacle 72.

Figure 2A:
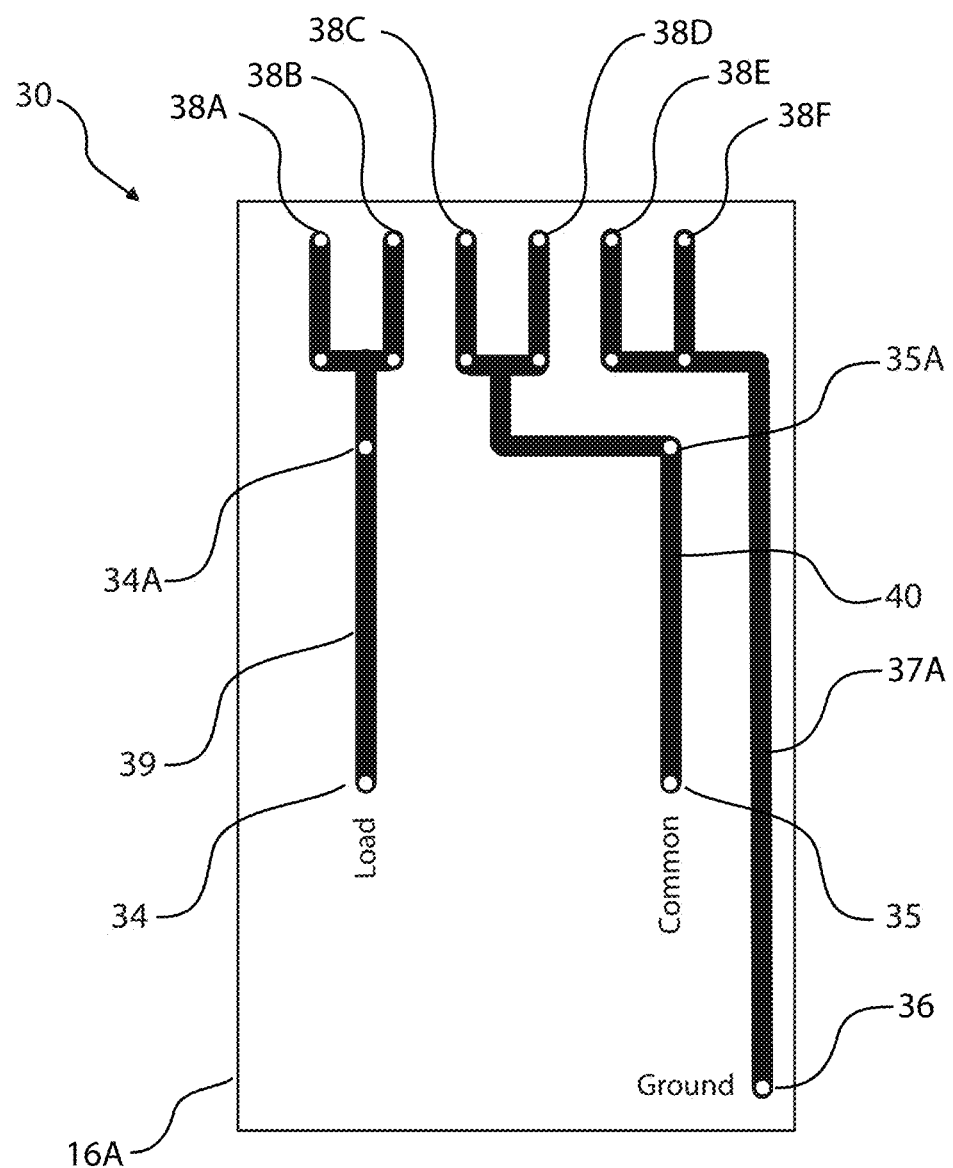
FIG. 2A is a front view of the printed circuit board showing representative traces.
Figure 2B:
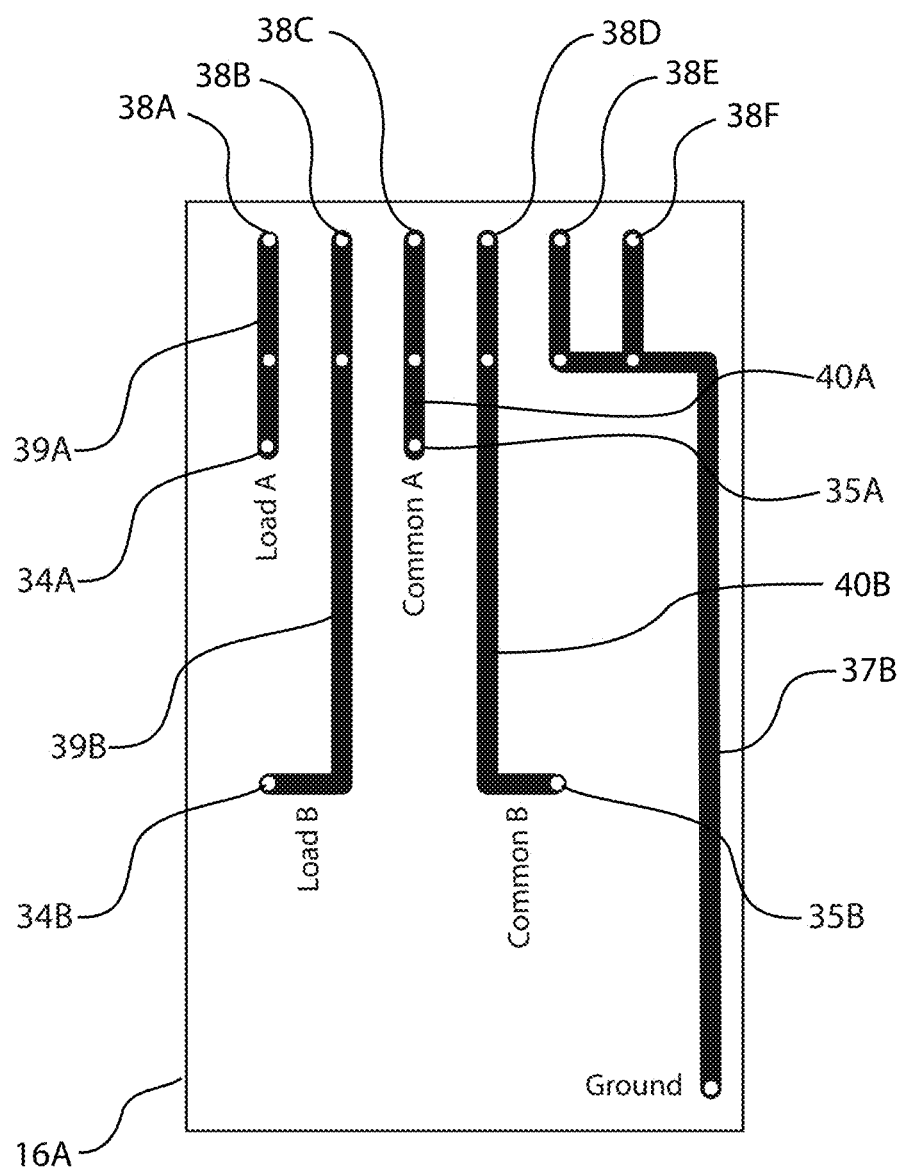
FIG. 2B is a front view of a different printed circuit board showing a different layout of representative traces.

In another related embodiment shown in FIG. 2B, traces 39A and 39B (formerly trace 39 of FIG. 2A) and traces 40A and 40B (formerly trace 40 of FIG. 2A) have been split and rerouted to allow 39A (Load) and 40A (Common) to carry current from one isolated circuit and traces 39B (Load) and 40B (Common) to carry current to another isolated circuit.

Figure 10:
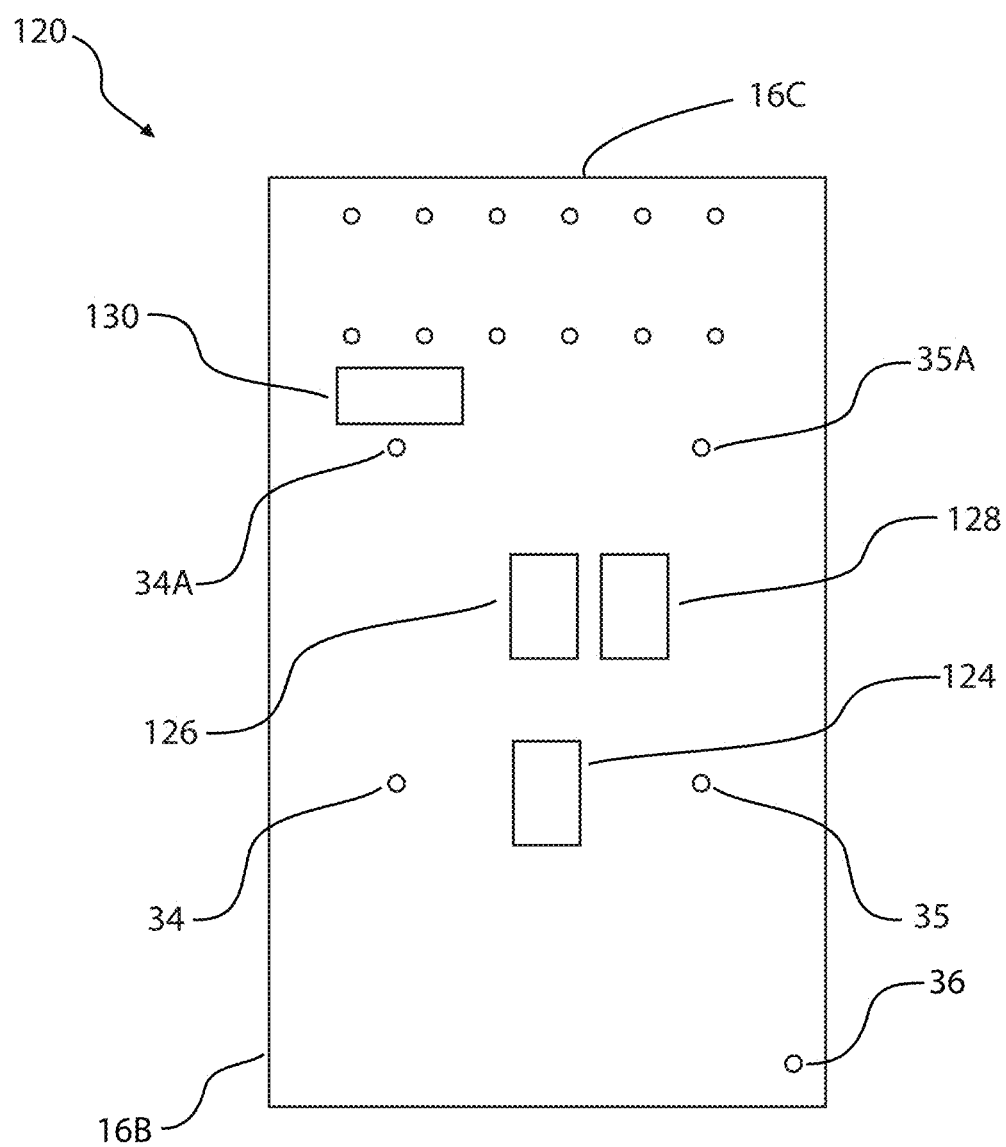
FIG. 10 is a schematic representation depicting a plurality of integrated circuit chips to provide power, processing capability, and wireless communication allowing a user to interact with the circuitry.

In a second exemplary embodiment an apparatus assembly and system is disclosed where a plurality of integrated chips (ICs) have been added to PCB 16B shown in FIG. 10. In this embodiment, IC 124 is a power supply IC 124 and is connected through PCB traces (not shown) and converts AC current derived from the Load and Common traces (not shown) into DC current and voltage. The DC current is directed to ICs 126, 128, and 130. In this embodiment, IC 126 is a microprocessor containing volatile memory and non-volatile memory containing software or firmware programs that once executed provide control signals to ICs 128 and 130. IC 128 is a circuit interrupter/dimmer. IC 130 is a communications module providing an access port to and from IC 126 to and from a user terminal allowing a user to turn on appliances connected to an associated receptacle or to vary the amount of voltage and current being provided to associated appliances or receptacles connected to an associated receptacle or master receptacle.

In a related embodiment, IC 128 is a circuit interrupter which when commanded to be in a on-state by microprocessor IC 126 provides voltage and current to, for example, a lighting appliance connected to an electrical receptacle associated with PCB 16B of FIG. 10 and when commanded to be in a off-state by microprocessor IC 126 turns voltage and current the lighting appliance connected to an electrical receptacle associated with PCB 16B of FIG. 10.

In a related embodiment, IC 128 is a circuit dimmer which when commanded to be in any on-state by microprocessor IC 126 ranging from no voltage and current to full voltage and current to, for example, a lighting appliance connected to an electrical receptacle associated with PCB 16B of FIG. 10 providing dimming control over the lighting appliance.

In a related embodiment IC 130 is a communication module allowing for wireless communications between microprocessor IC 126 and a wireless user terminal such as but not limited to be a computer device such as but not limited to be a desktop computer, laptop computer, tablet computer, cell phone, smart phone, personal digital assistant, or other such device. IC 130 may communicate to user wireless terminal using protocols such as any variation of 802.11 or Bluetooth, or any proprietary protocol.

In another related embodiment, power supply IC 124 may contain an internal battery or capacitor or be connected to an external battery or capacitor (neither shown) such that if AC current to power supply 124 is interrupted, IC 124 will send a power loss signal to microprocessor IC 126 alerting it to the power loss condition allowing microprocessor IC 126 to attempt to notify any user terminal it has been configured to communicate with that power to PCB has been lost.

DETAILED DESCRIPTION OF THE INVENTION

Objects and advantages of the present invention will become apparent to those skilled in the art upon reading this description in conjunction with the accompanying drawings, in which like reference numerals have been used to designate like or analogous elements.

Now referencing FIG. 1 where 10 depicts an exploded view of the depicted assembly. In this depiction, subcomponents case 14 is the main enclosure containing PCB 16B (back view). PCB 16A (front view FIG. 2A) has a plurality of printed circuit traces with a plurality of holes depicted in FIG. 2A as 38A through 38F. Each of holes 38A through 38F has a corresponding hole directly below it Each of the lower holes is electrically connected with the upper numbered hole (38A-38F) directly above. Each set of two numbered holes, 38A and 38B, 38C and 38D, and 38e and 38F are electrically connected via PCB trace 39 (38A-38B), PCB trace 38C and 38D via PCB trace 40, and 38E and 38F via PCB trace 37A. When mounted in subcomponents case 14, the front surface of PCB 16A (shown with the PCB traces) is facing the back surface of subcomponents case 14 and mated with spring cage 12, which has a plurality of pins (12A through 12F each of which has a pin directly above it that is electrically connected to the numbered pin below), that once the back surface of spring cage 12 and the front surface of PCB 16A are in physical contact, said pins protruding from the back surface of spring case 12 pass through PCB 16A and the plurality of holes in printed circuit traces located in two rows at the top of said PCB 16A such that said pins and said traces are electrically connected through soldering or welding. Said PCB 16A contains 4 pins 18A through 18D and a ground spade pin 20 all of which extend through bottom enclosure cover 22 of FIG. 1. Note that holes 22A through 22C are round such that PCB pins 18A through 18D can pass through bottom enclosure cover 22 and bottom enclosure cover hole 22E is elongated or slotted such that Ground spade pin 20 can pass through it. Pins 18A through 18D are hardened wire with the non-soldered end rounded over to facilitate insertion into a spring tension clamps contained on the back surface of receptacle 72 (shown in FIG. 6). The soldered end of pins 18A through 18F is flared and soldered to their respective PCB traces on the front surface of PCB 16A such that the flared end cannot be pulled through PCB 16B.

Now referencing FIG. 2A where 16A depicts the front surface of PCB 16A. A plurality of PCB traces are depicted. Note the 2 rows of 6 holes in the upper arms of each PCB trace. These holes receive, from the back surface of PCB 16A, the matching 12 pins from the front surface of spring cage 12. PCB trace 37A depicted on the right side of PCB 16A surface is longer than the other shorter 2 traces 39 and 40 depicted to the left of said long trace 37 of FIG. 2A. Traces 39 and 40 are the Load (Hot) and Common (Neutral traces). Also note that on PCB 16A traces 39 and 40 have 4 additional holes, 2 of which are present on PCB trace 39 and 2 on PCB trace 40. These holes are positioned such that pins are mounted in each hole and soldered or welded and extend outward through the back surface of said PCB 16A such that they will pass through bottom enclosure cover 22 and enter matching tension clamp holes 72A/C and 72B/D (shown in FIG. 6) in the back surface of electrical receptacle 72 shown in FIG. 6). The configurations of said traces are depicted showing a typical configuration for accommodating a standard 15 AMP/20 AMP electrical receptacle. The configuration of traces and pins may be reconfigured to accommodate different standard electrical receptacles and power circuits such as but not limited to:

Single Pole Single Throw Switch
Single Pole Double Throw Switch
Double Pole Single Pole Throw Switch
Double Pole Double Throw Switch
Standard 15 AMP Outlet
Standard 20 AMP Outlet
Ground Fault Circuit Interrupter
Arc Fault Circuit Interrupter
Switched Outlet
Any Standard Receptacle With One Or More USB Sockets
Standard Receptacles for Europe, India, Pakistan, China (PRC), Taiwan, South East Asia, Australia, Middle East, Africa, Russia, or any country possessing standards of electrical receptacles.

Now referencing FIG. 2B where 16A depicts the front surface of the PCB 16A. A plurality of PCB traces are depicted. Note the 2 rows of 6 holes in the upper arms of each PCB trace. These holes receive the matching 12 pins from the back surface of spring cage 12. PCB trace 37B depicted on the right side of PCB 16A surface is longer than the other shorter 4 traces 39A/39B and 40A/40B depicted to the left of said long trace 37B. Traces 39A/39B are the 2 Load (Hot) traces and 40A/40B are the 2 Common (Neutral traces). Also note on PCB 16A traces 39A/39B and 40A/40B are 2 additional holes, 1 of each are present on PCB traces 39A/39B and 2 additional holes, 1 each on PCB traces 40A/40B. These holes are positioned such that pins are mounted in each hole and soldered or welded and extend outward through the back surface of said PCB 16A such that they will pass through bottom enclosure cover 22 and enter matching tension clamp holes 72A, 72B, 72C, and 72D in the back surface of electrical receptacle 72 shown in FIG. 6. The configurations of said traces are depicted showing a typical configuration with separate power for traces 39A/B and 40A/B being different phases or protected circuits for accommodating a standard 15 AMP/20 AMP electrical receptacle.

Figure 3:
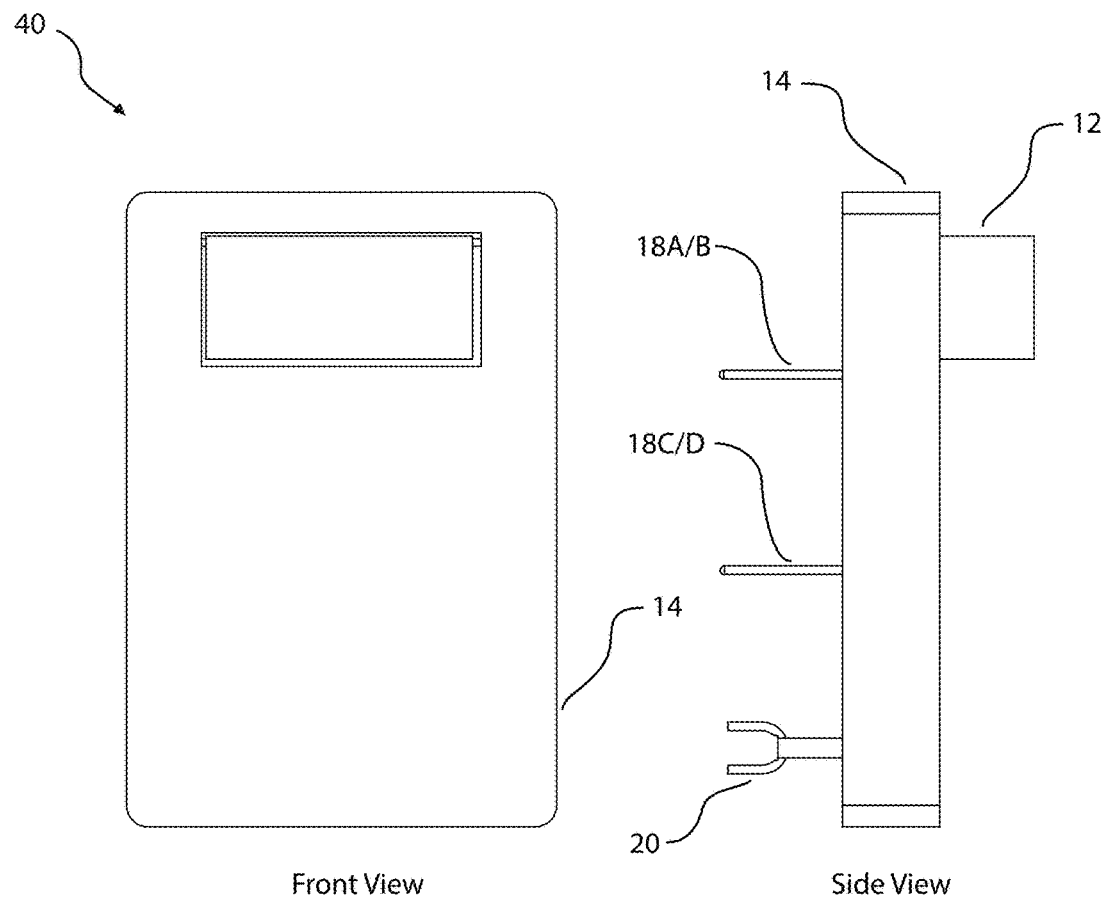
FIG. 3 is back and side view showing subcomponents case 14, spring cage 12, PCB pins 18A/18B, 18C/18D, and ground spade pin 20.

Now referencing FIG. 3 where 40 depicts the back view of subcomponents case 14 and the side view of subcomponents case 14 showing spring cage 12 and pins 18A/B and pins 18C/D, and ground spade pin 20. In this depiction, pins 18A/B and 18C/D are horizontally and vertically aligned with tension clamp access holes 72A-72D of receptacle 72 shown in FIG. 6.

Figure 4:
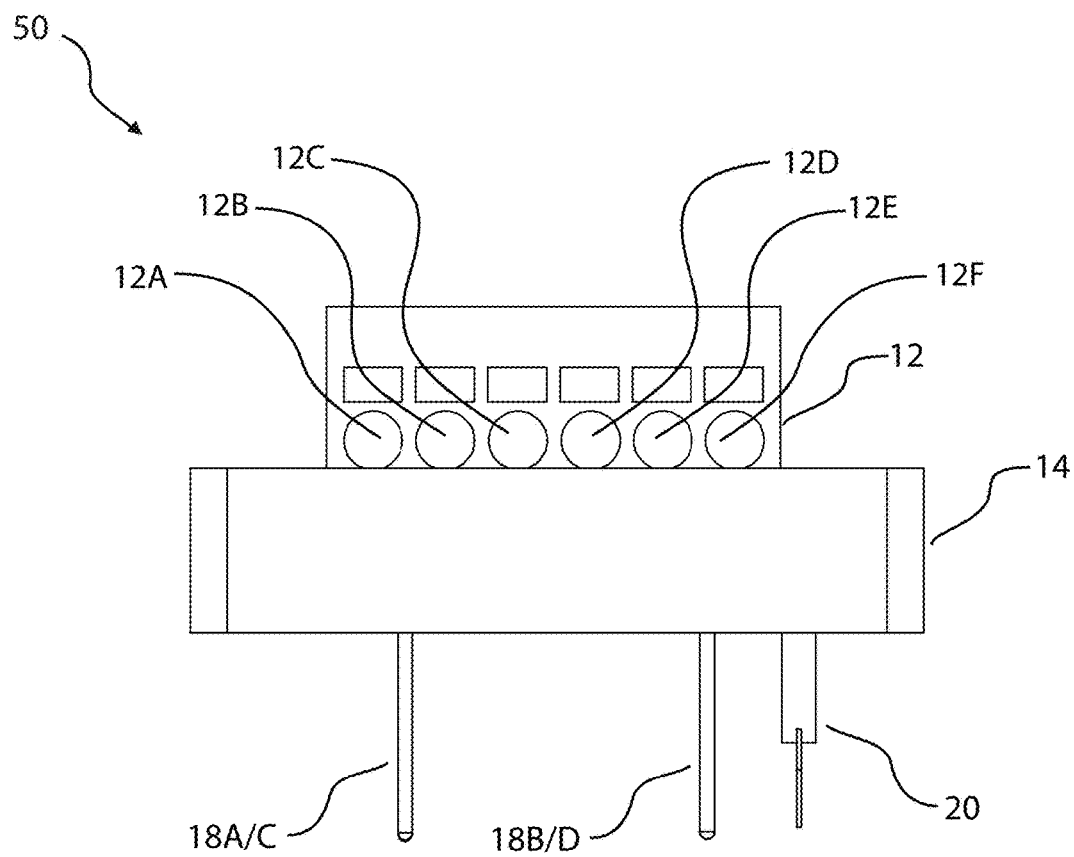
FIG. 4 is a bottom end view of subcomponents case 14 showing the bottom view of spring cage 12, PCB pins 18A/18C and 18B/18D and ground spade pin 20.

Now referencing FIG. 4 where 50 depicts a bottom end view of subcomponents case 14 and spring cage 12. In this depiction, pins 18A/C and pins 18B/D and ground spade pin 20 mounted on PCB 16A/B are (not shown) extending through bottom enclosure cover 22 (not shown). In this depiction, note that the bottom view of spring cage 12, there are 6 holes depicted as 12A-12F wherein a tension clamp is contained within the cavity behind holes 12A-12F such that once a wire is inserted into one of holes 12A-12F depicted on the bottom of spring cage 12, the wire will be secured from being pulled out by the associated tension clamp. Each set of 2 adjacent wires will be connected to two of the adjacent holes shown on PCB 16 such that the two ground wires will be inserted into the two left holes 12A and 12B, the 2 Common wires 12C and 12D, and the 2 Load wires 12E and 12F in spring cage 12.

Figure 5:
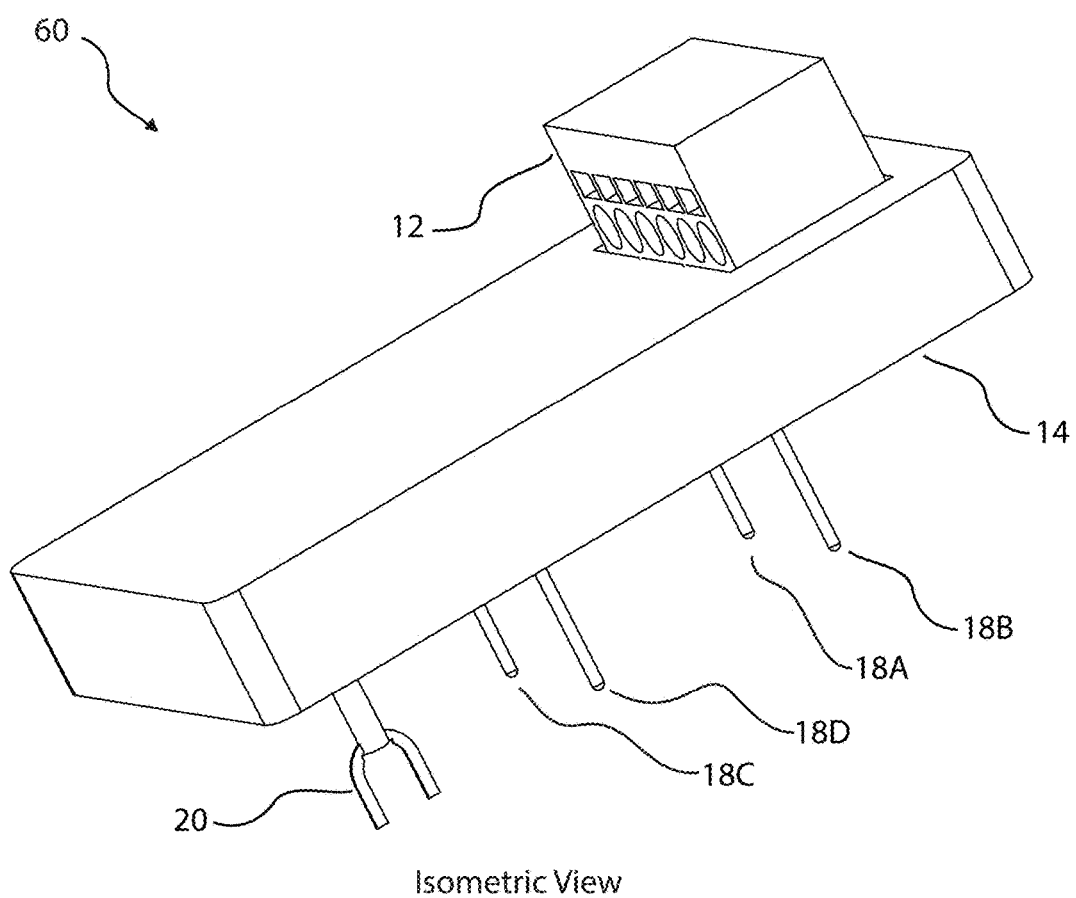
FIG. 5 is an isometric view of the back, side, and bottom of subcomponents case 14 showing spring cage 12, PCB pins 18A, 18B, 18C, 18D, and ground spade pin 20.

Now referencing FIG. 5 where 60 depicts an isometric view of the end and sides of subcomponents case 14 and spring cage 12 with pins 18A-18D and ground spade pin 20 shown extended through bottom enclosure cover 22 (not shown).

Now referencing FIG. 6 where 70 depicts an isometric view of subcomponents case 14 with spring cage 12 and electrical receptacle 72. In this depiction, pins 18A-18D are shown in alignment, with dotted lines, between tension clamp holes 72A-72D. Ground spade pin 20 is shown in alignment to securing screw 72E with dotted lines between Ground spade pin 20 and securing screw 72E.

Figure 7:
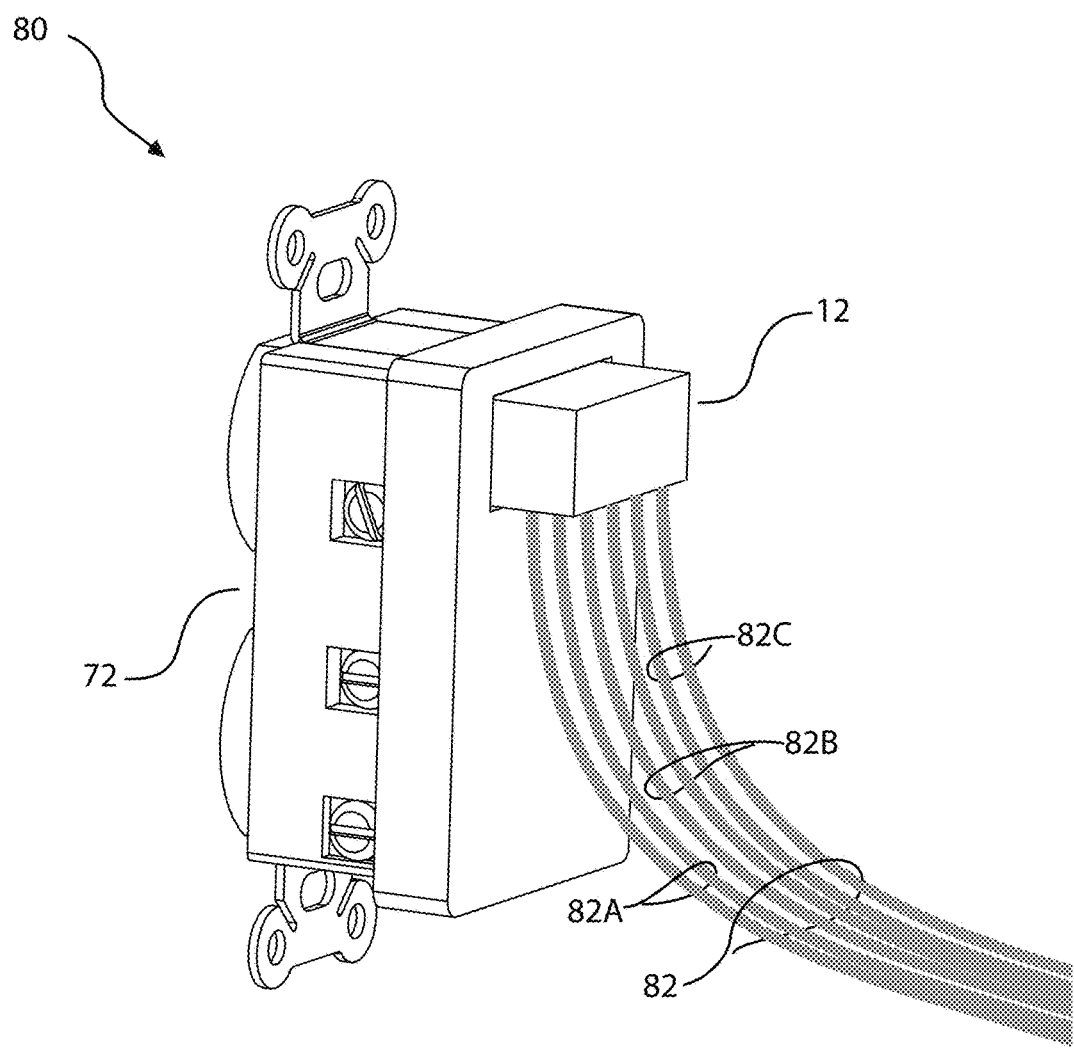
FIG. 7 is an isometric side, back, and top view of subcomponents case 14 in a connected state with receptacle 72 and spring cage 12 with wire bundle 82 connected.

Now referencing FIG. 7 where 80 depicts a side and back view of subcomponents case 14 and electrical receptacle 72 in a connected state and spring cage 12 with wire bundle 82 connected at one end into the plurality of holes 12A-12F on the bottom of spring cage 12, not visible. Wire bundle 82 is arranged in sets of 2 adjacent wires consisting of 3 sets of 2 wires where the left most set 82A consists of the 2 Ground wires, 82B, the center set, consists of the 2 Common wires, and 82C, the rightmost set, consists of the 2 load wires of FIG. 7.

Figure 8:
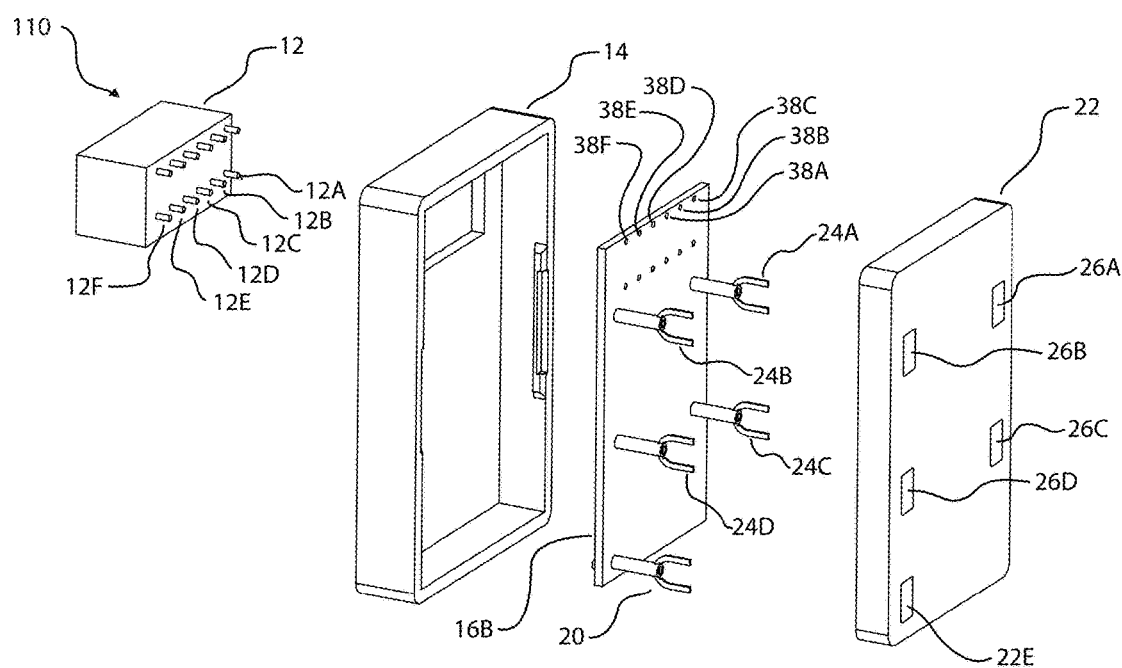
FIG. 8 is an exploded view of the of subcomponents case 14, spring cage 12 with a plurality of pins arranged as 2 rows of 6 pins in each row, printed circuit board (PCB) 16, PCB spade pins 24A-24D, ground spade pin 20, and bottom enclosure cover 22 making up the assembly.

Now referencing FIG. 8 where 110 depicts an exploded view of the depicted assembly. In this depiction, subcomponents case 14 is the main enclosure containing PCB 16 (A/B). PCB 16A (not shown) has a plurality of printed circuit traces with a plurality of holes depicted in FIG. 2 as 38A through 38F. Each of holes 38A through 38F has a corresponding hole directly below it. Each of the lower holes is electrically connected with the numbered hole (38A-38F) directly above. Each set of two numbered holes, 38A and 38B, 38C and 38D, and 38e and 38F are electrically connected via PCB trace 39 (38A-38B), PCB trace 40 (38C and 38D) and PCB trace 37A (38E and 38F). When mounted in subcomponents case 14, the front surface of PCB 16A (surface with the PCB traces not shown) is facing the back inside surface of subcomponents case 14 and mated with spring cage 12, which has a plurality of pins (12A through 12F each of which has a pin directly above it that is electrically connected to the numbered pin below), that once the back surface of spring cage 12 and the front surface of PCB 16A are in physical contact, said pins protruding from the back surface of spring case 12 pass through PCB 16 and the plurality of holes in printed circuit traces located in two rows at the top of said PCB 16A such that said pins and said traces are electrically connected through soldering or welding to soldering pads on PCB 16B. Said soldering pads are electrically connected to their corresponding traces via plated through holes. Said PCB 16A contains 4 spade pins 24A through 24D and ground spade pin 20 all of which extend through bottom enclosure cover 22. Note that holes 26A through 26C are slots such that PCB spade pins 24A through 24D can pass through bottom enclosure cover 22 and bottom enclosure cover hole 22E is a slot such that ground spade pin 20 can pass through it.

Now referencing FIG. 9 where 70 depicts an isometric view of subcomponents case 14 with spring cage 12 and electrical receptacle 72. In this depiction, pins 24A-24C are shown in alignment, with dotted lines, with securing screws 74A/C (not shown) and securing screws 74B/D (shown). Ground spade pin 20 is shown in alignment to securing screw 72E with dotted lines between Ground spade pin 20 and securing screw 72E.

Now referencing FIG. 10 where 120 depicts printed circuit board 16B. In this depiction, holes 34 and 34A support pins that connect to receptacle 72 shown in FIGS. 1, 6, 8 and 9. Holes 35 and 35A support pins that connect to receptacle 72 shown in FIGS. 1, 6, 8 and 9. Hole 36 supports ground spade pin 20 that connects to receptacle 72 shown in FIGS. 1, 6, 8 and 9. Objects 124-130 depict integrated circuits ICs. In this depiction, IC 124 depicts a power supply and is located between holes 34 and 34A which are connected to PCB load trace 39 shown in FIG. 2 and holes 35 and 35A which are connected to a PCB common trace 40 shown in FIG. 2. IC 124 converts alternating current to DC current of a sufficient voltage and current to provide operating power to ICs 126, 128, and 130. IC 126 is a microprocessor with PCB connections (not shown) to circuit interrupter/dimmer control IC 128 and communications IC 130. Communications IC 130 provides wireless communications between a user and microprocessor 126. The communications protocol provided by communications IC 130 may be any version of Wifi 802.11, or any version of Bluetooth, or may be a propriety wireless protocol.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein, may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. The processor can be part of a computer system that also has a user interface port that communicates with a user interface, and which receives commands entered by a user, has at least one memory (e.g., flash memory or other comparable storage, and random access memory) that stores electronic information including a program that operates under control of the processor and with communication via the user interface port which may be a wired or wireless port.

A processor may also be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM) or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. The memory storage can also be rotating magnetic hard disk drives, optical disk drives, or flash memory based storage drives or other such solid state, magnetic, or optical storage devices. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. The computer readable media can be an article comprising a machine-readable non-transitory tangible medium embodying information indicative of instructions that when performed by one or more machines result in computer implemented operations comprising the actions described throughout this specification.

Operations as described herein can be carried out on or over a website. The website can be operated on a server computer, or operated locally, e.g., by being downloaded to the client computer, or operated via a server farm. The website can be accessed over a mobile phone or a PDA, or on any other client. The website can use HTML code in any form, e.g., MHTML, or XML, and via any form such as cascading style sheets ("CSS") or other.

Also, the inventor intends that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus for simplifying installation of electrical receptacles/switches comprising:
   a. a first box consisting of non-conducting fire-resistant plastic of such size as to fit into a first open front single or multi-gang electrical junction box, said first plastic box has a back part, an open front part, and top and bottom and side parts, and
   b. a second box consisting of non-conducting fire resistant plastic containing a plurality of spring tension clamp access holes arranged across the front bottom surface of said second box, said access holes and spring tension clamps to receive a first set of two conductors carrying electrical load current, a second set of two conductors providing an electrical common return, and a third set of two conductors providing an electrical ground return, and a first plurality of pins consisting of an upper row and a bottom row protruding from the front of said second box, said first set of pins in each row of pins electrically connected to a matching pin in said bottom row of said pins and each set of said upper and lower pins connected to at least one of said plurality of spring tension clamps, and
   c. a printed circuit board consisting of a plurality of printed circuit traces on the back side of said printed circuit board, said printed circuit board contains a first set of two rows of holes in said printed circuit board with each row consisting of a plurality of holes that are electrically connected to said plurality of printed circuit traces and said holes physically aligned to accept said first set of pins protruding from said back side of said second box, said holes are plated through holes with solder pads electrically connected from the back side of said printed circuit board to said traces on the front side of said printed circuit board via said plated through holes, said first set of pins protruding from said back of said second box extending through said printed circuit board are fixed in place by being soldered to said soldering pads on the back side of said printed circuit board, and a second set of pins of sufficient length with flared ends to prevent said second set of pins soldered to said front side of said printed circuit board from being pulled through said printed circuit board and said second set of pins protruding through said printed circuit board, said pins soldered to said traces such that two of said second set of pins are connected to a said trace carrying electrical load current, two of said second set of pins are connected to a said trace providing an electrical common return, and one of said second set of pins connected to said trace providing a ground return, and four of said second set of pins are round hardened wire with the non-soldered end being rounded over such that they can be inserted into a spring tension clamp hole on the back of an electrical receptacle and said pin soldered to said ground return trace has a ground spade lug on the non-soldered end, and d. said first box has a cutout at the top back side portion sufficient in size to allow said second box connected to said printed circuit board to protrude through said cutout when said printed circuit board is inserted into said first box, and e. a plate consisting of non-conducting fire resistant plastic with four round holes and a rectangular hole positioned such that four of said second set of pins and said pin with said spade lug on said non-soldered end can pass through said plate and protrude a sufficient length for four of said pins to be inserted into the back side of said receptacle and be retained by spring tension clamps in the interior of said receptacle and said pin with said spade lug positioned such that said spade lug can be connect to said receptacle by being secured to a ground spade connector on said receptacle through use of a securing screw.

2. The apparatus of claim 1 where said second set of pins are 14 gage in diameter such that they can be retained by said receptacle tension clamps requiring 14 gage wire.

3. The apparatus of claim 2 where said second set of pins are of a different gage diameter to accommodate electrical receptacles/switches not conforming to standards used in the United States of America.

4. The apparatus of claim 1 where said second set of pins are square instead of round to provide greater surface area to the receptacle/switches spring clamping arms.

5. The apparatus of claim 1 where said second set of pins all have a spade lug on the non-soldered end and said traces are repositioned and the holes on said plate are all rectangular instead of round and are positioned such that the said set of spade pins are connected to said receptacle through the use of securing screws on receptacles/switches instead of spring tension clamps.

6. The apparatus of claim 1 where said printed circuit board has a single trace that conducts load current and a single trace that conducts a common return, and a. said single load trace is connected to said second set of pins where each pin conducts load current from a separate source and, b. said single common return trace is connected to said second set of pins where each pin conducts a common return to a separate return sink and, c. said single load trace is split such that one load trace is connected to one set of pins instead of two pins such that each of said split load traces conducts current from a separate load circuit, and d. said single common return trace is split such that one common return trace is connected to one set of pins instead of two sets of pins such that each of said split common return traces provides a common return to a separate common return circuit.

7. A system for simplifying installation of electrical receptacles comprising:

a. a first box consisting of non-conducting fire-resistant plastic of such size as to fit into a first open front single or multi-gang electrical junction box, said first plastic box has a back part, an open front part, and top and bottom and side parts, and a second box consisting of non-conducting fire-resistant plastic that protrudes through a cutout on said back part of said first box, and a printed circuit board consisting of a plurality of printed circuit traces on the back side of said printed circuit board, a plurality of plated through holes with solder pads on the back side of said printed circuit board electrically connected to said traces on said front of said printed circuit board via said plated through holes, and a plate consisting of non-conducting fire-resistant plastic forming the front surface of said first box, said plate containing a series of holes and a slot to accommodate a plurality of conducting pins protruding through said plate from said printed circuit board;

b. said second box containing a plurality of spring tension clamps and access holes arranged across the bottom back surface of said second box, said access holes and spring tension clamps to receive in sets of two conductors carrying electrical load current, a set of two conductors providing an electrical common return, and a set of two conductors providing an electrical ground return, and a first plurality of pins consisting of an upper row and a bottom row protruding from the back of said second box, said upper row of pins electrically connected to matching pins in said bottom row of said pins and each set of said upper and low pins connected to at least one of said plurality of spring tension clamps, and c. said printed circuit board contains a first set of two rows of plated through holes in said printed circuit board with each row consisting of a plurality of holes that are electrically connected to said plurality of printed circuit traces and said holes physically alighted to accept said first set of pins protruding from said back side of said second box, said holes in said printed circuit board are plated through holes with solder pads on the back side of said printed circuit board and electrically connected to said traces on the front side of said printed circuit board via said plated through holes, said first set of pins protruding from said back of said second box extending through said printed circuit board are fixed in place by being soldered to said soldering pads on the back side of said printed circuit board, and a second set of pins of sufficient length soldered to said front side of said printed circuit board and protruding through said printed circuit board, said pins soldered to said traces such that two of said second set of pins are connected to a said trace carrying electrical load current, two of said second set of pins are connected to a said trace providing an electrical common return, and one of said second set of pins connected to said trace providing a ground return, said second set of pins are round and the non-soldered end being rounded over such that they can be inserted into a spring tension clamp hole on the back of an electrical receptacle and said pin soldered to said ground return trace has a spade lug on the non-soldered end, and d. said first box has a cutout at the top back side portion sufficient in size to allow said second box connected to said printed circuit board to protrude through said cutout when said printed circuit board is inserted into said first box, and e. a plate consisting of non-conducting fire resistant plastic with four round holes and a rectangular hole positioned such that four of said second set of pins and said pin with said ground spade lug on said non-soldered end can pass through said plate and protrude a sufficient length for four of said pins to be inserted into the back side of said receptacle and be retained by spring tension clamps interior to said receptacle and said pin with said spade lug positioned such that said spade lug can be connect to said receptacle by being secured to a ground connector on said receptacle through use of a securing screw.

* * * * *